United States Patent [19]
Li et al.

[11] Patent Number: 5,761,116
[45] Date of Patent: Jun. 2, 1998

[54] $V_{PP}$ ONLY SCALABLE EEPROM MEMORY CELL HAVING TRANSISTORS WITH THIN TUNNEL GATE OXIDE

[75] Inventors: Xiao-Yu Li, San Jose; Radu Barsan, Cupertino, both of Calif.

[73] Assignee: Advanced Micro Devices, Inc., Sunnyvale, Calif.

[21] Appl. No.: 726,512

[22] Filed: Oct. 7, 1996

[51] Int. Cl.[6] .................... G11C 16/04; H01L 29/788
[52] U.S. Cl. ........................... 365/185.1; 365/185.18; 365/187; 257/319; 257/321; 257/392
[58] Field of Search ...................... 365/185.1, 185.18, 365/182, 187, 188; 326/44; 257/319, 321, 392

[56] References Cited

U.S. PATENT DOCUMENTS 4,885,719  12/1989  Brahmbhatt .................. 365/185.17
4,924,278   5/1990  Logie ............................... 257/318
5,331,590   7/1994  Josephson et al. ............... 365/182

*Primary Examiner*—Viet Q. Nguyen
*Assistant Examiner*—Andrew Q. Tran
*Attorney, Agent, or Firm*—Fliesler, Dubb, Meyer & Lovejoy LLP

[57] ABSTRACT

An enhanced, scalable EEPROM memory cell is provided with a structure having a plurality of half-height tunnel oxide depletion mode transistors. The structure further has individual wordlines controlling the write and read transistors, respectively. With such a structure, lower voltages are used to program/erase the memory cell. The memory cell is scalable to small dimensions through the use of transistors having half-height tunnel oxide regions.

12 Claims, 3 Drawing Sheets

$V_{PP}$ ONLY SCALABLE EEPROM MEMORY CELL HAVING TRANSISTORS WITH THIN TUNNEL GATE OXIDE

FIELD OF THE INVENTION

The present invention relates to electrically erasable and programmable read-only memory devices and more particularly to an improved EEPROM cell having smaller layout size, lower program/erase voltage requirements, higher sense speed and better endurance and data retention than conventional EEPROMS.

BACKGROUND OF THE INVENTION

One of the more recent generation of memories is the electrically erasable and programmable read-only memory (EEPROM), which allows its program contents to be electrically erased; thereby allowing reprogramming. Unlike conventional erasable programmable read-only memories (EPROMS), which are generally erased in bulk by exposure to ultraviolet (UV) light, an EEPROM allows electrical erasure.

EEPROM cells have been recently extensively used in programmable logic devices (PLD's). Most conventional EEPROM cells are formed of three transistors: a write transistor, a read transistor and a sense transistor. In conventional EEPROM cells, the control gates of the write transistor and read transistor are connected to the same wordline. Also, in conventional EEPROM cells the read transistor and the sense transistor are connected to the same data (bitline), thereby when the read transistor is turned on, the sense transistor is effectively used as the storage cell of the EEPROM.

In operation, to program conventional EEPROMS, a high voltage (between 13 and 15 volts) is applied to the wordline of the EEPROM memory cell. A relatively high voltage (approximately 11-12 volts) is applied to the control gate of the write transistor, allowing the voltage applied on the bitline to be transferred to the control gate of the sense transistor, thus causing the EEPROM cell to be written to.

To erase the EEPROM cell, a voltage $V_{cc}$ is applied to the wordline of the write transistor which, at the same time, causes the read transistor to also be turned on. Zero volts is applied to the bitline, which is connected to the drain of the read transistor. A high voltage (between 13-15 volts) is applied on the capacitor coupled control gate (ACG). Under this bias condition, the high voltage applied to ACG is coupled to the floating gate of the sense transistor which causes electrons to tunnel from the floating gate of the sense transistor, through the tunneling window of the EEPROM memory cell, thereby erasing the sense transistor.

As discussed above, programming and erasing the sense transistor is performed through the same tunneling window. This requires the use of a high voltage, $V_{pp}+V_{t}$, of approximately 13-15 volts to be applied to the control gate of the sense transistor. Using such a high voltage requires the gate oxide of the sense transistor to be relatively thick (approximately 150-200 Å). Also, because the wordline is connected to both the write transistor and the read transistor, the tunnel oxide thickness of the read transistor also must be relatively thick (approximately 150-200 Å). Scaling down (reducing component size) of transistors having such a large oxide thickness cannot be achieved due to basic device physics. This presents a problem because the trend in the electronics industry is to have smaller and smaller memory cells being able to effectively store larger and larger amounts of data. Because conventional EEPROMS require transistors having relatively thick tunnel oxide layers, effective scaling down of the conventional EEPROM structure cannot be done.

Another drawback associated with the conventional EEPROM structure is that the thick tunnel oxide, set by data retention requirements, slows down the speed with which the EEPROM cell can be read. This is also contrary to the industry trend of manufacturing faster PLDs.

Thus, there is a need to provide an EEPROM memory cell structure which provides scalability and faster operating speeds, while at the same time using smaller program/erase voltages, thereby increasing the endurance and data retention of the EEPROM memory cell.

SUMMARY OF THE INVENTION

An enhanced EEPROM memory cell structure incorporating a first depletion mode transistor, an enhancement mode transistor, and a second depletion mode transistor, the control gate of the first depletion mode transistor and the enhancement mode transistor being separate is presented. The structure also includes the tunnel oxide of the enhancement mode transistor and the second depletion mode transistor having a thickness of approximately 80 Å, thereby providing a structure which overcomes the scaling and power requirement limitations of conventional EEPROM cell structures. Further, a tunnel diode is provided between the first depletion mode transistor and the second depletion mode transistor. In programming the EEPROM memory cell, a lower voltage ($10-12\ V_{PP}$) is applied to the memory cell. $11-12\ V_{PP}$ is also used when erasing the EEPROM cell of the present invention. The structure of the present invention has two separate wordlines providing voltages to both the depletion mode transistors and the enhancement mode transistor. By providing a structure having two separate wordlines, the erasing of the EEPROM memory cell of the present invention is performed through the sense transistor. Whereas, programming of the EEPROM of the present invention is performed through the tunnel diode. Further, by applying a smaller voltage to the memory cell, the endurance and data retention of the memory cell is increased.

The EEPROM cell of the present invention is comprised of: a first depletion mode transistor having a source, drain and gate, with the drain of the first depletion mode transistor being connected to a first voltage line; a first wordline coupled to the gate of the first depletion mode transistor; an enhancement mode transistor having a source, drain and gate, with the drain of the enhancement mode transistor being coupled to a second voltage line; a second wordline coupled to the control gate of the enhancement mode transistor; a second depletion mode transistor having a source drain and a gate, with the drain of the second depletion mode transistor being connected to a second voltage line and further having a half-height tunnel oxide thickness.

An advantage of the present invention is the ability to scale down the size of the EEPROM memory cell.

Another advantage of the present invention is that it requires smaller voltages to program and erase the memory cell.

A feature of the present invention is that because of the smaller gate oxide thicknesses, the overall transistor size can be reduced, thus allowing for faster program, erase and reading speeds.

BRIEF DESCRIPTION OF THE DRAWINGS

These and other advantages and features of the present invention will become apparent from the following description of the embodiments, taken in conjunction with the accompanying drawings, where like numerals represent like elements, in which.

DETAILED DESCRIPTION OF THE EMBODIMENTS

Figure 1:
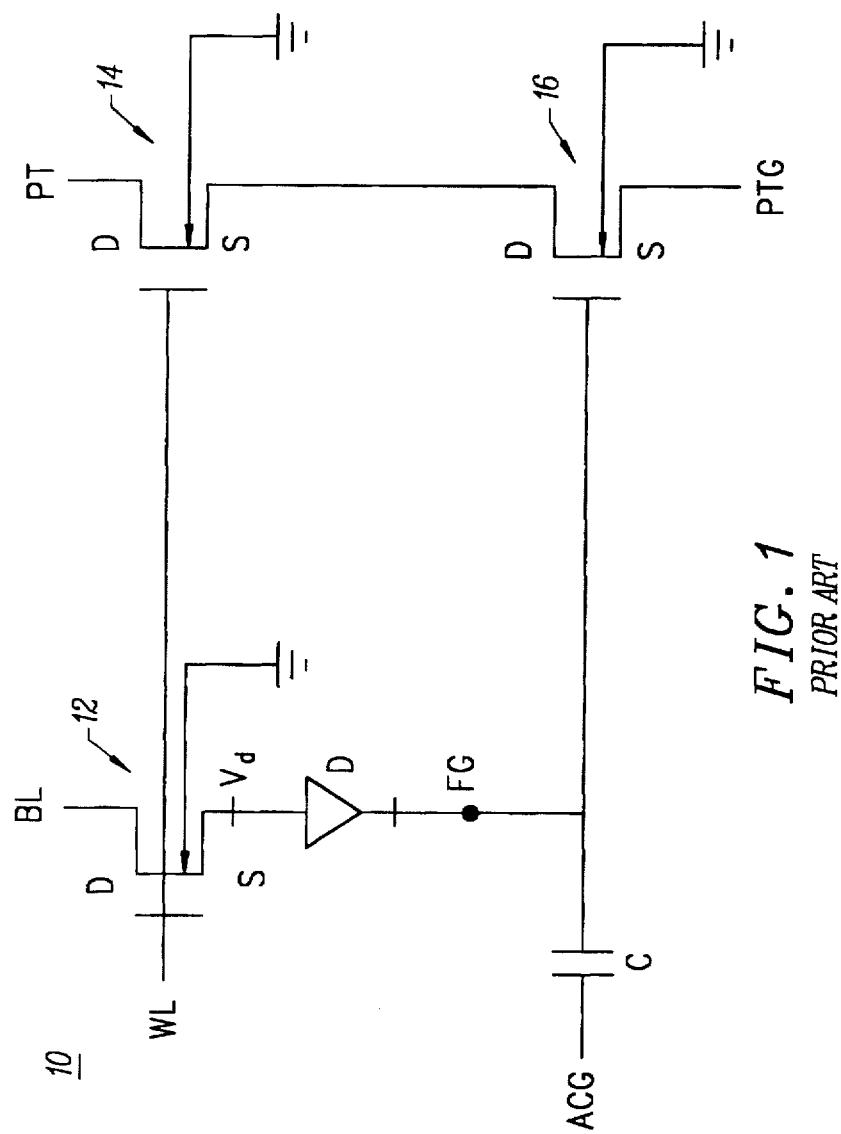
FIG. 1 is a schematic diagram of a conventional EEPROM memory cell structure.

As discussed above, conventional EEPROM memory cells have a three transistor structure, which is used to store and retrieve bits of data. FIG. 1 shows a conventional EEPROM memory cell structure 10. As shown in FIG. 1, the conventional EEPROM memory cell consists of a write transistor 12, an enhancement mode read transistor 14, a sense transistor 16, a control gate capacitor C and a tunneling diode D. Note that in the conventional structure, a wordline (WL) connects to both the enhancement mode write transistor 12 and the enhancement mode read transistor 14. Each of the three transistors has drain and source regions marked D and S, respectively. The operation of the conventional EEPROM memory cell is summarized in Table 1 below.

TABLE 1

| OPERA-TION | WBL | WL | PT | PTG | ACG | SUB-STRATE |
|---|---|---|---|---|---|---|
| Read | 0 | $V_{cc}$ | $V_{sense}$ | 0 | 0 | 0 |
| Program | $V_{PP}$ | $V_{PP}+V_t$ | Floating | 0 | 0 | 0 |
| Erase | 0 | $V_{cc}$ | Floating | $V_{PP}$ | $V_{PP}+V_t$ | 0 |

When programming the memory cell, an intermediate voltage, $V_{PP}$ (typically 11V–12 V) is applied to the bitline of the write transistor 12 and a relatively high voltage $V_{PP}+V_t$ (typically between 13–15 V) is applied to the wordline in order to pass $V_{PP}$ through the tunneling diode D to the sense transistor 16. Under this bias condition, a voltage drop is present across $V_d$ and the floating gate FG. Electrons are tunneling from the floating gate to $V_d$, which results in the floating gate of the sense transistor 16 becoming positively charged and the sense transistor 16 being turned on.

When erasing the memory cell, a relatively high voltage $V_{PP}+V_t$ (typically between 13–15V), is required on the capacitively coupled control gate (ACG) due to an erase coupling ratio. Under this bias condition, a voltage drop is present across the floating gate FG and $V_d$. Electrons are tunneling from $V_d$ to floating gate FG, thereby negatively charging FG and the sense transistor 16 is turned off.

When reading the contents of the memory cell, zero volts is applied to the bitline of the write transistor 12. A voltage, $V_{CC}$, is applied to the wordline (WL), with a voltage $V_{sense}$ being applied to the drain of the read transistor 14. For each operation (read, program, erase), the substrate is held at ground potential. The high voltage $V_{PP}+V_t$ (between 13–15V) can be generated through an internal charge pumping circuit (not shown). However, the higher the voltage $(V_{PP}+V_t)$ needed, the more complex the semiconductor process and circuitry required.

The substrate of the tunnel diode D is highly doped (N+) and referred to as a program junction. It is known that the quality of the oxide growth on the program junction is severely degraded and is thicker (greater than 90 Å). As the tunnel oxide degrades, memory cell data retention reduces greatly and also prevents the transistors making up the EEPROM memory cell from having scaled-down oxide thicknesses.

The enhancement mode read transistor 14 and the sense transistor 16 form a cell data sense speed path. The voltage applied on the enhancement mode read transistor 14 and the write transistor 12 during programming is typically $V_{PP}+V_t$; therefore, the enhancement mode write transistor 12 requires a thick gate oxide. The voltage applied to the sense transistor 16 is 11–12 volts $V_{PP}$ and therefore the sense transistor 16 has a thick gate oxide (150 Å) in order to prevent electron tunneling through the gate oxide of the sense transistor 16. Because of device physics, the thick oxide layers of the enhancement mode read transistor 14 and the sense transistor 16 of conventional EEPROM memory cells cannot be scaled down. The non-scalability of the sense transistor 16 prevents the scaling down of the entire EEPROM memory cell 10.

Figure 2:
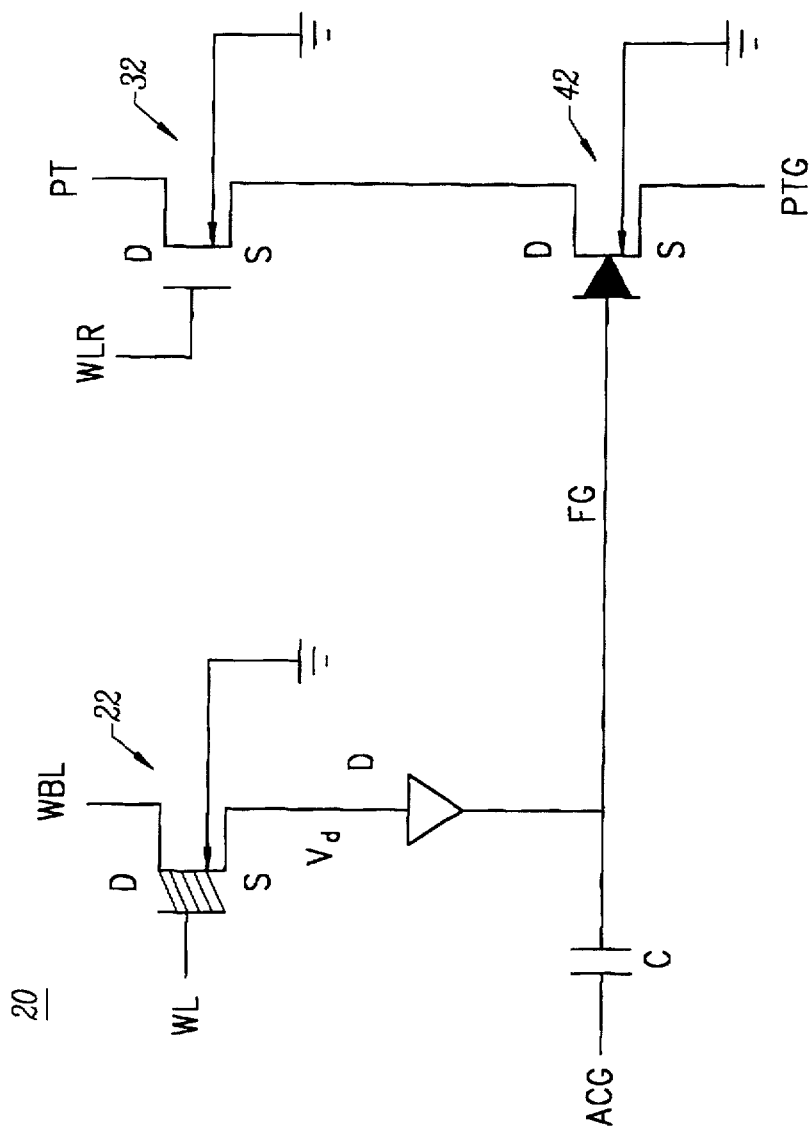
FIG. 2 is a schematic diagram showing the EEPROM memory cell structure according to the present invention.

FIG. 2 illustrates a schematic diagram of the enhanced EEPROM memory cell structure 20 according to the present invention. As shown in FIG. 2, the EEPROM structure of the present invention incorporates a depletion mode write transistor 22, an enhancement mode read transistor 32, a thin gate tunnel oxide depletion mode sense transistor 42, a control gate capacitor C and a tunneling diode D. The gate capacitor couples the ACG to the depletion mode sense transistor 42, thereby controlling the floating gate, FG. The cell of the present invention has different programs/erase operating values than that of the conventional EEPROM memory cell depicted in FIG. 1.

Figure 3:
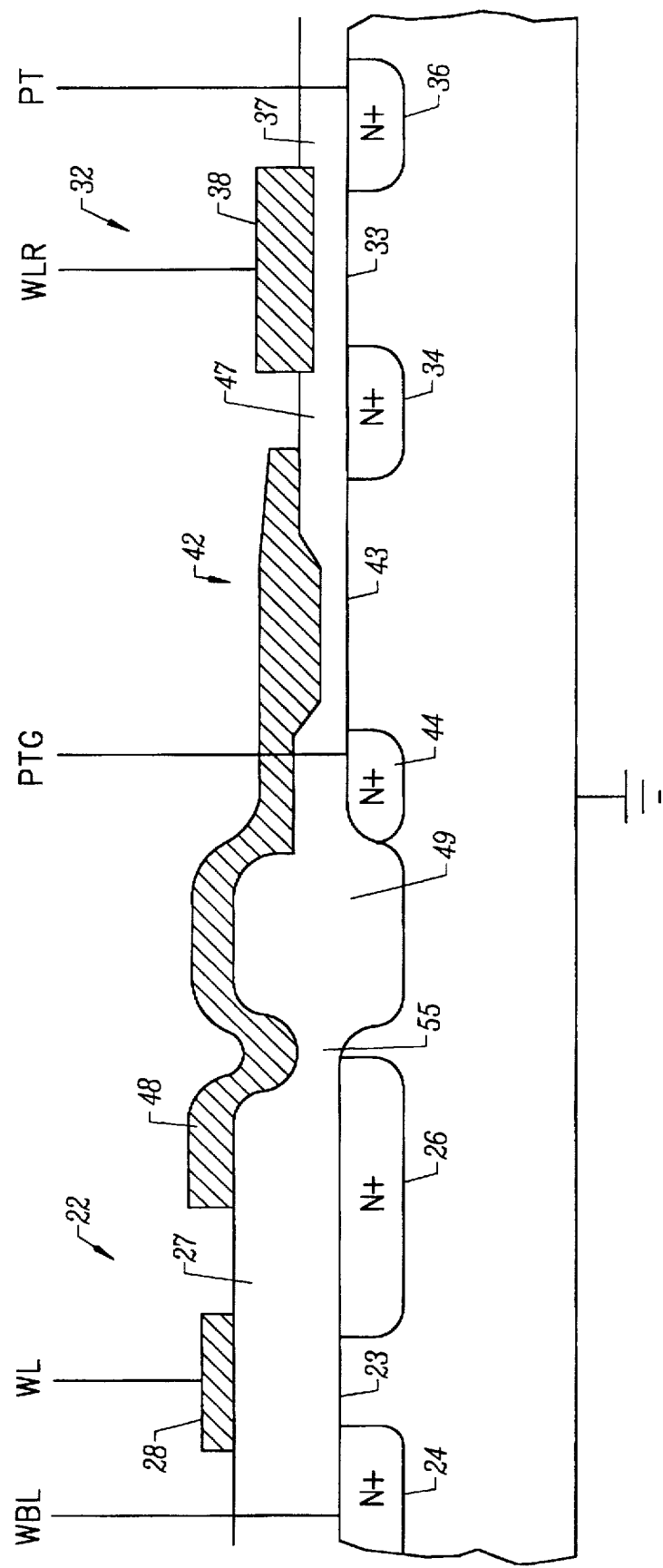
FIG. 3 is a cross sectional view of an EEPROM memory cell structure according to the present invention.

FIG. 3 shows a cross sectional side view of the EEPROM structure depicted in FIG. 2. In FIG. 3, a P-type semiconductor substrate 50 has 5 N+ type regions formed on and below its surface by standard diffusion techniques. These 5 N+ type regions correspond to the source and drain regions of the three transistors which make up the EEPROM memory cell depicted in FIG. 2. A depletion mode write transistor 22 comprises a drain 24, a source 26, a channel region 23 between the drain 24 and the source 26, a gate oxide layer 27 having a thickness of approximately 150 Å and a control gate 28 formed on top of gate oxide layer 27. Bitline WBL is connected to the drain 24, while a first wordline WL is connected to the control gate 28 of the transistor.

Enhancement mode read transistor 32 comprises a drain 36, a source 34, and a channel region 33 between the drain 36 and source 34. On top of the channel region 33 is a half-height tunnel oxide 37 having a thickness of approximately 80 Å. Formed on top of the tunnel oxide is a control gate 38. The control gate is connected to a second wordline WLR, while the drain of the read transistor 32 is coupled to a product term line PT.

The depletion mode sense transistor 42 comprises a source 44, a drain 34, (which is also the source 34 of the read sense transistor 32), a channel region 43 between the drain 34 and a source 44, respectively. Polysilicon floating gate 48 is capacitively coupled to the source 34 via gate oxide layer 47, which has a thickness of approximately 80 Å, and capacitively coupled to source 26 of the depletion mode write transistor 22 via tunnel oxide layer 55. Tunnel oxide layer 55 has a thickness of approximately 80 Å. The floating gate 48 also extends over channel region 43 of the depletion mode sense transistor 42 so that when sufficient positive charge is present on the floating gate 48, the channel 43 will invert and conduct current between the source 34 and the drain 44 of the depletion mode sense transistor 42. Field oxide layer 49 insulates the floating gate 48 from the underlying substrate 50 separating the depletion mode sense transistor 42 and the depletion mode write transistor 22. The thickness of the field oxide layer 49 is approximately 150 Å.

Operation of the EEPROM memory cell of the present invention will now be described with reference to Table 2 below and FIGS. 2 and 3.

The three operations of the EEPROM memory cell are read, program, and erase. The various voltages applied to the circuit depicted in FIGS. 2 and 3 are presented below in Table 2.

TABLE 2

| OPERATION | WBL | WL | WLR | PT | PTG | SUBSTRATE |
|---|---|---|---|---|---|---|
| Read | 0 | $V_{cc}$ | $V_{cc}$ | $V_{sense}$ | 0 | 0 |
| Program | $V_{PP}$ | $V_{PP}$ | 0 | Floating | 0 | 0 |
| Erase | $V_{PP}$ | $V_{PP}$ | $V_{cc}$ | 0 | 0 | 0 |

When programming the memory cell of the present invention, $V_{PP}$ (about 11-12V) is supplied on both the bitline WBL of the depletion mode write transistor 22 and the wordline WL coupled to depletion mode write transistor 22. The lower voltage level can be used because the write transistor 22 is a depletion mode transistor. The product term voltage provided on the bitline of the read transistor 32 is left floating. The wordline (WLR) of the read transistor 32, the PTG line (which corresponds to the source of the EEPROM cell) of the sense transistor 42, and the substrate 50 are all tied to ground.

One concern of using depletion mode transistors is the possibility of write disturb occurring in the non-selected memory cell during programming. Testing of the EEPROM memory cell by the inventors has shown that as long as $V_d$ is less than 3.5V, a write disturb of the non-selected cell does not occur. Thus, the threshold voltage of the depletion mode write transistor 22 should be designed such that no more than 3.5V is allowed to be passed to $V_d$ when write transistor 22 is not selected. More specifically, the threshold voltage of the write transistor 22 should be held around −0.4 volts. An example of such a transistor can be found in U.S. Pat. No. 5,666,309, issued Sep. 9, 1997, entitled "Memory Cell For A Programmable Logic Device (PLD) Avoiding Pumping Program Voltage Above An NMOS Threshold," incorporated fully herein and assigned to the assignee of the present invention.

Erasing the EEPROM memory cell of the present invention is provided by supplying a voltage, $V_{PP}$, to the bitline WBL of the write transistor 22; supplying a voltage $V_{PP}$ to the wordline of the write transistor 22; supplying a higher voltage $V_{CC}$ (about 13–15V) to the wordline (WLR) of the enhancement mode read transistor 32; and providing $V_{PP}$ to ACG. The product term (PT) coupled to the drain of the read transistor 32, PTG and the substrate 50 are held at ground potential. Under this bias condition, electrons are tunneling through the gate oxide of the depletion mode sense transistor 42. Since the gate oxide thickness (approximately 80 Å) of the depletion mode sense transistor 42 is not grown on a highly doped substrate, the oxide quality is better and the thinner tunnel oxide thickness provides good data retention. $V_{PP}$ is applied on both bitline WBL and wordline WL to prevent the electrons from tunneling through diode D and increase the erase coupling ratio. As a result, a lower voltage $V_{PP}$ can be used to program and erase the memory cell of the present invention, not the higher voltages $V_{PP}+V_t$ and $V_{PP}$ required by the prior art.

When reading information stored in the EEPROM memory cell of the present invention, zero volts is applied to the bitline WBL of the write transistor 22. $V_{CC}$ is applied to the wordline WLR of the read transistor 32 and an intermediate voltage, $V_{sense}$ (usually about 1.5V), is applied to the drain 36 of the read transistor 32 over line PT. The substrate 50 and ACG are held at ground potential. Under this bias condition, current flows between the drain 36 and the source 44 if the depletion mode sense transistor 42 is on, indicating a logic 1. If the depletion mode sense transistor 42 is off, current does not flow, indicating a logic 0.

In an alternative embodiment of the present invention, the sense transistor 42 may be an enhancement mode transistor. With an enhancement mode transistor acting as the sense transistor, $V_{CC}$ would be applied to ACG during the read operation.

Since the sense transistor 42 and the read transistor 32 are depletion mode devices, the channel lengths of these two transistors can be made shorter to increase reading speed. Also, because the tunnel oxide is not grown on a highly doped substrate, the tunnel oxide thicknesses can be decreased thereby allowing the EEPROM memory cell of the present invention to be programmed/erased using lower voltages than those required by conventional cells, thereby providing a smaller EEPROM cell size.

The embodiment described is manufactured using well known techniques, and their method of manufacture would be obvious to those skilled in the art. The foregoing description of the invention has been presented for purposes of illustration and description. It is not intended to be exhaustive or to limit the invention to the precise form disclosed, and obviously, modification and variation of the invention are possible in light of the above teaching. The $V_{PP}$ only scalable EEPROM memory cell was described in order to best explain the principles of the invention and its practical application, thereby enabling others skilled in the art to best utilize the invention in various embodiments and with various modifications as are suited to the particular use contemplated. It is intended that the scope of the invention be defined by the claims appended hereto.

What is claimed is:

1. A scalable memory cell, comprising:
    a first transistor having a source, a drain and a gate, the drain connected to a first voltage line;
    a first wordline coupled to the gate of the first transistor;
    a second transistor having a source, a drain and a gate, the drain coupled to a second voltage line;
    a second wordline coupled to the gate of the second transistor; and
    a third transistor having a source, a drain and a gate coupled to the source of the first transistor, the drain having a source drain contact with the source of the second transistor, the second and third transistors having a half-height oxide thickness, wherein said memory cell is scalable.

2. The memory cell of claim 1, wherein the first transistor is a depletion mode transistor.

3. The memory cell of claim 1, wherein the second transistor is an enhancement mode transistor.

4. The memory cell of claim 1, wherein the third transistor is a depletion mode transistor.

5. The memory cell of claim 1, wherein the source of the second transistor and the drain of the third transistor comprise a joint contact junction.

6. The memory cell of claim 5, wherein a low voltage ($V_{PP}$) is used to program/erase the memory cell.

7. The memory cell of claim 1, wherein the third transistor is an enhancement mode transistor.

8. A memory cell, comprising:

a substrate of semiconductor material having a first conductivity type;

a first drain region, doped with a material having a conductivity type different from the substrate;

a first source region doped with the material having a conductivity type different from the substrate;

a first channel region separating the first drain region and the first source region;

a half-height tunnel oxide region provided over the first drain region, the first source region and the first channel region, the half-height tunnel oxide region having a thickness of about 80 Å;

a first control gate formed on the half-height tunnel oxide region;

a second drain region doped with the material having a conductivity type different from the substrate;

a second source region doped with the material having a conductivity type different from the substrate;

a second channel region separating the second drain region and the second source region;

an oxide region provided over the second drain region, the second source region and the second channel region, the oxide region having a thickness of about 150 Å;

a second control gate formed on the oxide region; and a third source region doped with the material having a conductivity type different from the substrate, the first source region acting as the drain region complementing the third source region.

9. The memory cell of claim 8, wherein the substrate is formed of p-type material.

10. The memory cell of claim 8, wherein the first drain region, the first source region, the second drain region, the second source region and the third source region are formed of N-type semiconductor material.

11. The memory cell of claim 8, wherein the first control gate is coupled to a first wordline.

12. The memory cell of claim 8, wherein the second control gate is coupled to a second, different wordline.

* * * * *